(12) United States Patent
Wei et al.

(10) Patent No.: US 12,218,419 B2
(45) Date of Patent: Feb. 4, 2025

(54) ANTENNA MODULE AND ANTENNA SYSTEM APPLYING THE ANTENNA MODULE

(71) Applicant: MEDIATEK INC., Hsin-Chu (TW)

(72) Inventors: Chia-Yen Wei, Hsinchu (TW); Jen-Chun Wen, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 162 days.

(21) Appl. No.: 18/085,508

(22) Filed: Dec. 20, 2022

(65) Prior Publication Data

US 2023/0216186 A1 Jul. 6, 2023

Related U.S. Application Data

(60) Provisional application No. 63/296,034, filed on Jan. 3, 2022.

(51) Int. Cl.
| | | |
|---|---|---|
| *H01Q 1/24* | (2006.01) | |
| *H01Q 1/22* | (2006.01) | |
| *H01Q 1/38* | (2006.01) | |
| *H01Q 1/42* | (2006.01) | |
| *H01Q 3/12* | (2006.01) | |
| *H05K 1/02* | (2006.01) | |
| *H05K 1/14* | (2006.01) | |

(52) U.S. Cl.
CPC .......... *H01Q 1/427* (2013.01); *H01Q 1/2283* (2013.01); *H01Q 3/12* (2013.01); *H05K 1/0243* (2013.01); *H05K 1/147* (2013.01); *H05K 2201/10098* (2013.01); *H05K 2201/10128* (2013.01)

(58) Field of Classification Search
CPC .......... H01Q 1/22; H01Q 1/2283; H01Q 1/24; H01Q 1/38; H01Q 1/42; H01Q 1/427; H01Q 21/28; H01Q 3/01; H01Q 3/12; H05K 1/02; H05K 1/0243; H05K 1/14; H05K 1/147; H05K 2201/10098; H05K 2201/10128

See application file for complete search history.

(56) References Cited

U.S. PATENT DOCUMENTS

| | | | | |
|---|---|---|---|---|
| 7,230,575 | B2 * | 6/2007 | Jeong | H01Q 1/362 343/702 |
| 9,065,175 | B2 * | 6/2015 | Corbin | H01Q 1/243 |
| 10,804,597 | B2 * | 10/2020 | Xia | H01Q 21/065 |
| 11,336,030 | B2 * | 5/2022 | Murata | H01Q 11/14 |
| 11,664,601 | B2 * | 5/2023 | Irci | H01Q 1/243 343/770 |
| 11,937,371 | B2 * | 3/2024 | Lin | H01Q 1/2283 |
| 2019/0027808 | A1 | 1/2019 | Mow | |
| 2020/0021015 | A1 | 1/2020 | Yun | |
| 2021/0344116 | A1 | 11/2021 | Dalmia | |
| 2021/0345492 | A1 | 11/2021 | Yeon | |

* cited by examiner

*Primary Examiner* — Tho G Phan
(74) *Attorney, Agent, or Firm* — Winston Hsu

(57) ABSTRACT

An antenna module, comprising: a first antenna device, which is an AiM (Antenna in Module) and comprises at least one first antenna; a first FPC (flexible printed circuit), coupled to an outer surface of the first antenna device via a conductive structure; and at least one second antenna device, coupled to the first FPC, comprising at least one second antenna. By this way, an antenna module which can change directions of antennas via simplified structures is provided. Further, an antenna system applying the antenna module is also provided.

17 Claims, 10 Drawing Sheets

Mode 1

Mode 2-1

ANTENNA MODULE AND ANTENNA SYSTEM APPLYING THE ANTENNA MODULE

CROSS REFERENCE TO RELATED APPLICATIONS

This application claims the benefit of U.S. Provisional Application No. 63/296,034, filed on Jan. 3, 2022. The content of the application is incorporated herein by reference.

BACKGROUND

For a conventional antenna module, the directions of antennas are always limited, thus the overall performance of the antenna module is limited since signals come from different directions. Further, the connections between different groups of antennas of the conventional antenna module are complex. Therefore, an antenna module which can change directions of antennas via simplified structures is needed.

SUMMARY

One objective of the present invention is to provide an antenna module which can change directions of antennas via simplified structures.

Another objective of the present invention is to provide an antenna system which can change directions of antennas via simplified structures.

One embodiment of the present invention discloses an antenna module, comprising: a first antenna device, which is an AiM (Antenna in Module) and comprises at least one first antenna; a first FPC (flexible printed circuit), coupled to an outer surface of the first antenna device via a conductive structure; and a second antenna device, coupled to the first FPC, comprising at least one second antenna.

Another embodiment of the present invention discloses an antenna system, comprising: a first substrate; a first antenna device, which is an AiM and provided on the first substrate, comprising at least one first antenna; a first FPC, coupled to an outer surface of the first antenna device via a conductive structure; and at least one second antenna device, coupled to the FPC, comprising at least one second antenna.

In view of above-mentioned embodiments, an antenna module which can change directions of antennas via simplified structures is provided. Further, an antenna system applying the antenna module is also disclosed.

These and other objectives of the present invention will no doubt become obvious to those of ordinary skill in the art after reading the following detailed description of the preferred embodiment that is illustrated in the various figures and drawings.

DETAILED DESCRIPTION

In the following descriptions, several embodiments are provided to explain the concept of the present application. The term "first", "second", "third" in following descriptions are only for the purpose of distinguishing different one elements, and do not mean the sequence of the elements. For example, a first device and a second device only mean these devices can have the same structure but are different devices.

Figure 1:
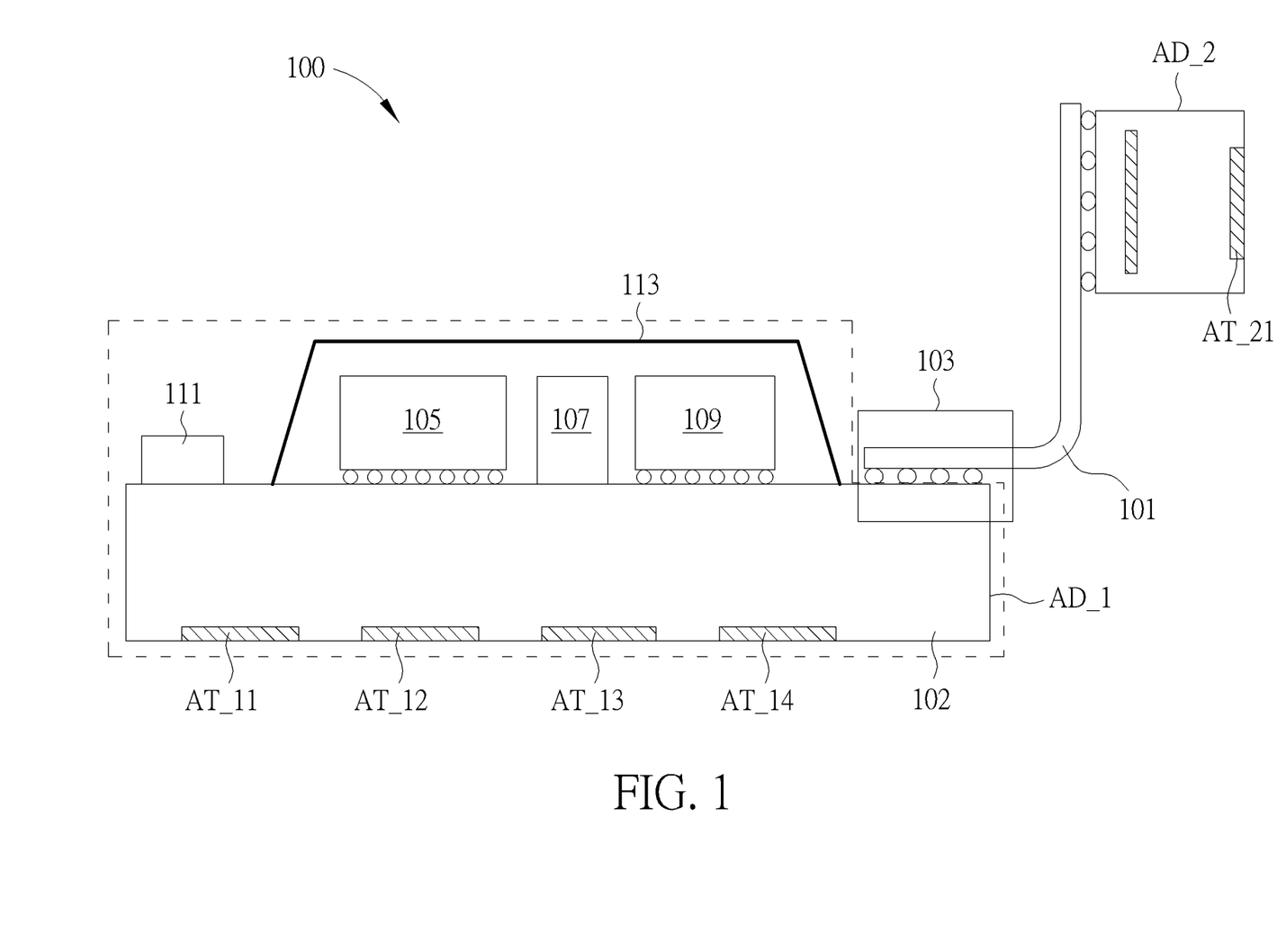
FIG. 1 is a schematic diagram illustrating an antenna module according to one embodiment of the present invention.

FIG. 1 is a schematic diagram illustrating an antenna module 100 according to one embodiment of the present invention. As illustrated in FIG. 1, the antenna module 100 comprises a first antenna device AD_1, a first FPC (flexible printed circuit) 101, and a second antenna device AD_2. The first antenna device AD_1 is an AiM (Antenna in Module) and comprises at least one first antenna (four first antennas AT_11, AT_12, AT_13, AT_14 in this example). The first antennas AT_11, AT_12, AT_13, AT_14 are provided in a substrate 102. The first FPC 101 is coupled to an outer surface of the first antenna device AD_1 via a conductive structure 103. In one embodiment, the conductive structure 103 comprises conductive balls or conductive bumps. Via the simple conductive structure, the connection between the first antenna device AD_1 and the first FPC 101 can be simplified. The second antenna device AD_2 is coupled to the first FPC 101 and comprises at least one second antenna (one second antenna AT_21 in this example).

In one embodiment, the first antennas AT_11, AT_12, AT_13, AT_14 are formed in one package and the second antenna AT_2 is formed in another package. Also, the second antenna device AD_2 can be formed by at least one antenna board. Further, in one embodiment, the second antenna device AD_2 is also coupled to the first FPC 101 via conductive balls or conductive bumps. Besides the first antennas AT_11, AT_12, AT_13, AT_14, the first antenna device AD_1 can further comprise other components. In one embodiment, the first antenna device AD_1 further comprises an RF (Radio frequency) IC 105, a passive component 107, a power management IC 109 and a connector 111. The RF IC 105, the passive component 107, and the power management IC 109 are covered by an EMI (Electromagnetic Interference) shield 113.

The second antenna device AD_2 can be changed to different locations via the first FPC 101, such that the second antenna AT_21 can have different directions. In following embodiments, a first location and a second location are taken as examples for explaining. However, it does not mean that the second antenna device AD_2 only can be located at the first location or the second location.

Figure 2:
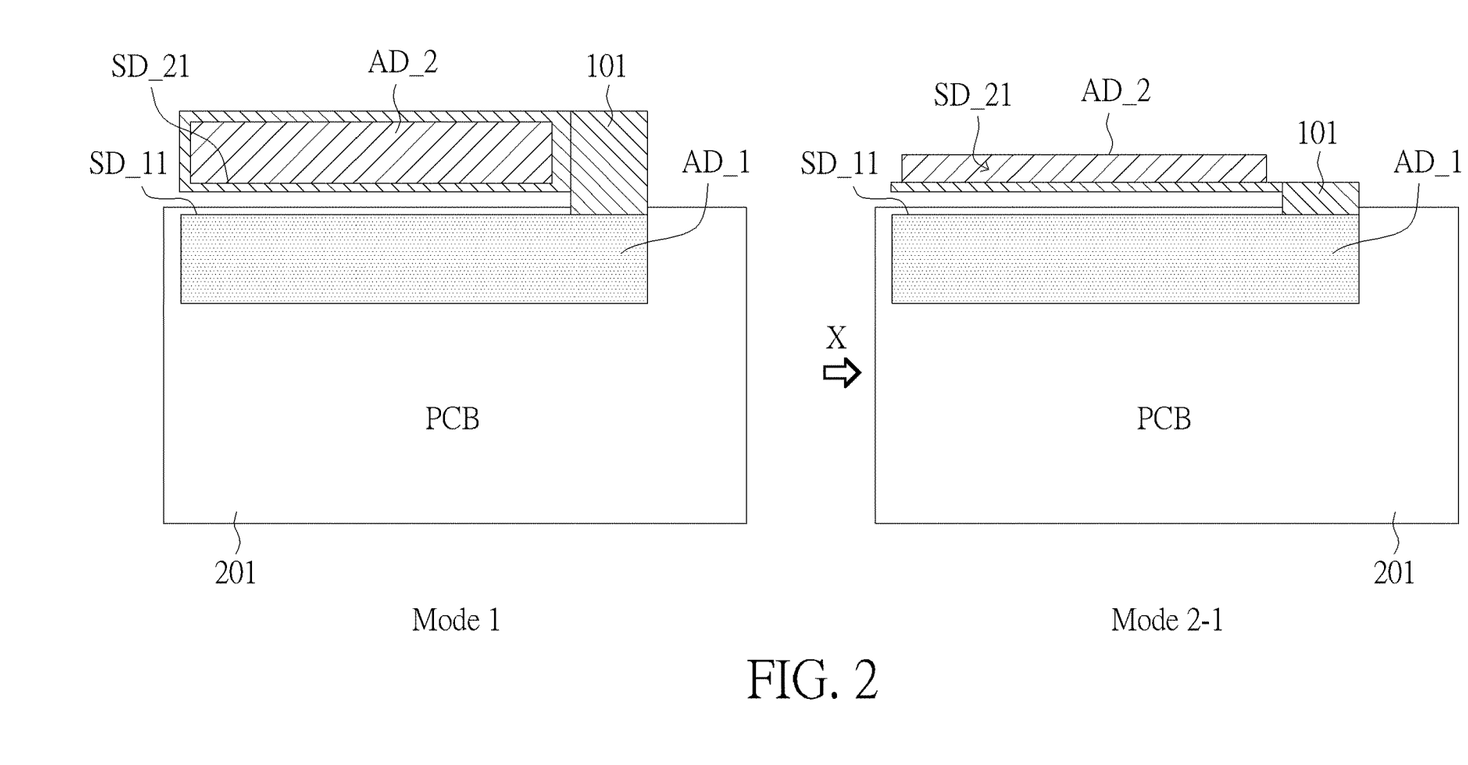
FIG. 2, FIG. 3, FIG. 4, FIG. 5, FIG. 6, FIG. 7, FIG. 8, FIG. 9, and FIG. 10 are schematic diagrams illustrating structures and operations of antenna modules according to different embodiments of the present invention.

In following embodiments, the first antenna device AD_1 is provided on a PCB (printed circuit board) 201, via a connection structure such as conductive adhesive, but not limited, or mechanical holder. In one embodiment, the first PCB 201 is a PCB of a display. However, the PCB 201 can be replaced by any other substrate. FIG. 2, FIG. 3, FIG. 4, FIG. 5, FIG. 6, FIG. 7, FIG. 8, FIG. 9, and FIG. 10 are schematic diagrams illustrating structures and operations of antenna modules according to different embodiments of the present invention. In the embodiment of FIG. 2, the second antenna device AD_2 is at a first location in the Mode 1 and is at a second location in the Mode 2-1. In the embodiment of FIG. 2, a first side SD_11 of the first antenna device AD_1 and a first side SD_21 of the second antenna device AD_2 are parallel with each other. For more detail, a first side SD_11 of the first antenna device AD_1 and a first side SD_21 of the second antenna device AD_2 are parallel with each other, regardless of whether the second antenna device AD_2 is located at the first location or the second location. Please note, the descriptions of "the first side SD_11 is parallel with the first side SD_21" can mean the "the first side SD_11 or an extension line of the first side SD_11 is parallel with the first side SD_21 or an extension line of the first side SD_21". In one embodiment, the first side SD_11 means a longest side of the first antenna device AD_1 and the first side SD_21 means a longest side of the second antenna device AD_2. Such rule can also be applied to other embodiments.

Figure 3:
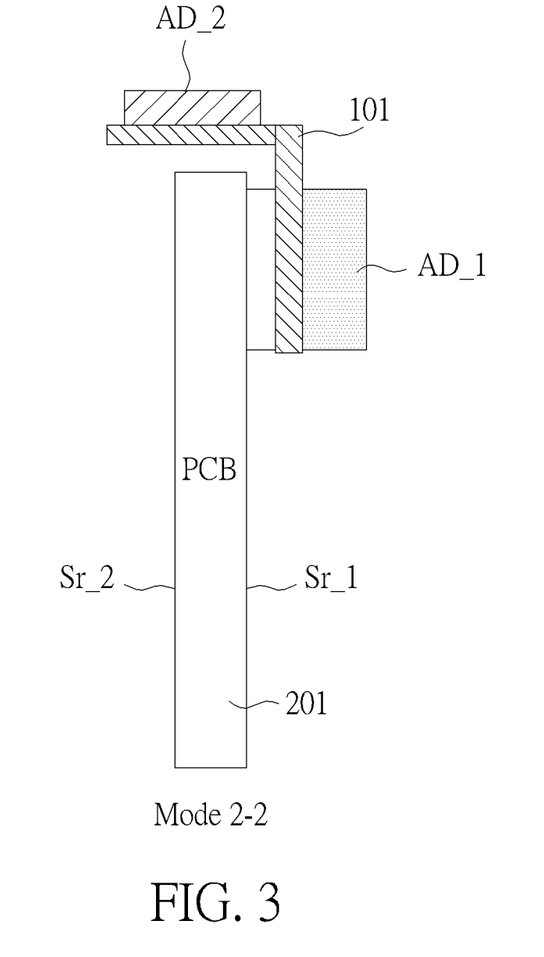

The Mode 2-2 in FIG. 3 and the mode 2-1 in FIG. 2 represent the same mode, and FIG. 3 is a diagram viewed from the X direction of the diagram marked with Mode 2-2 FIG. 2. Based on FIG. 3, a distance between a first surface Sr_1 of the first PCB 201 and the first antenna device AD_1 is smaller than a distance between a second surface Sr_2 of the first PCB 201 and the first antenna device AD_1. In one embodiment, the first surface Sr_1 and the second surface Sr_2 are opposite and parallel with each other. In such case, the first FPC 201 is bended following a direction from the first surface Sr_1 to the second surface Sr_2 when the second antenna device AD_2 changes from the first location to the second location.

Figure 4:
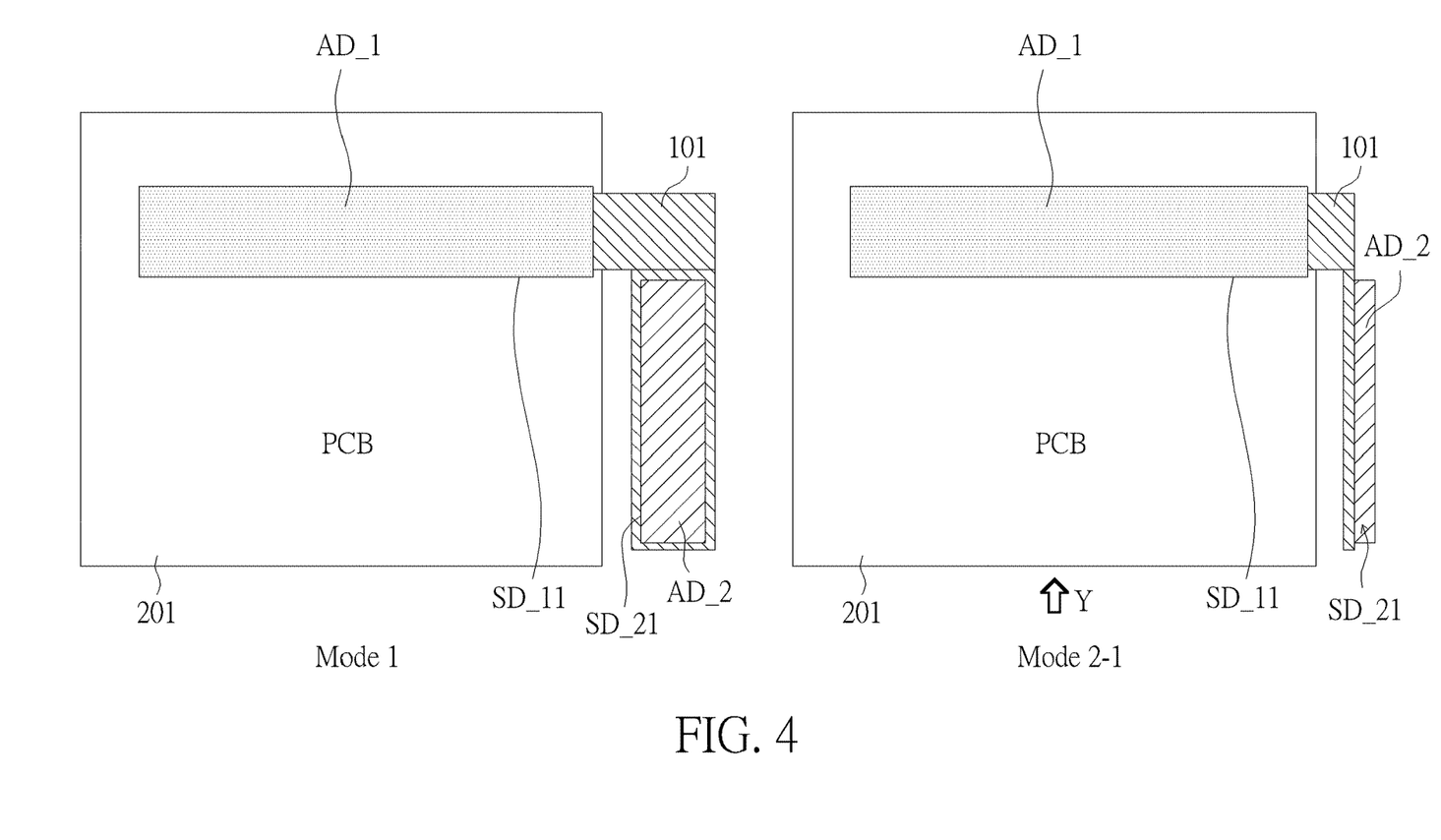

The locations of the first antenna device AD_1 and the second antenna device AD_2 are not limited to the embodiments illustrated in FIG. 2 and FIG. 3. In the embodiment of FIG. 4, the second antenna device AD_2 is at a first location in the Mode 1 and is at a second location in the Mode 2-1. In the embodiment of FIG. 4, a first side SD_11 of the first antenna device AD_1 and a first side SD_21 of the second antenna device AD_2 are perpendicular with each other. For more detail, a first side SD_11 of the first antenna device AD_1 and a first side SD_21 of the second antenna device AD_2 are perpendicular with each other, regardless of whether the second antenna device AD_2 is located at the first location or the second location. Please note, the descriptions of "the first side SD_11 is perpendicular with the first side SD_21" can mean the "the first side SD_11 or an extension line of the first side SD_11 is physically perpendicular with the first side SD_21 or an extension line of the first side SD_21".

Figure 5:
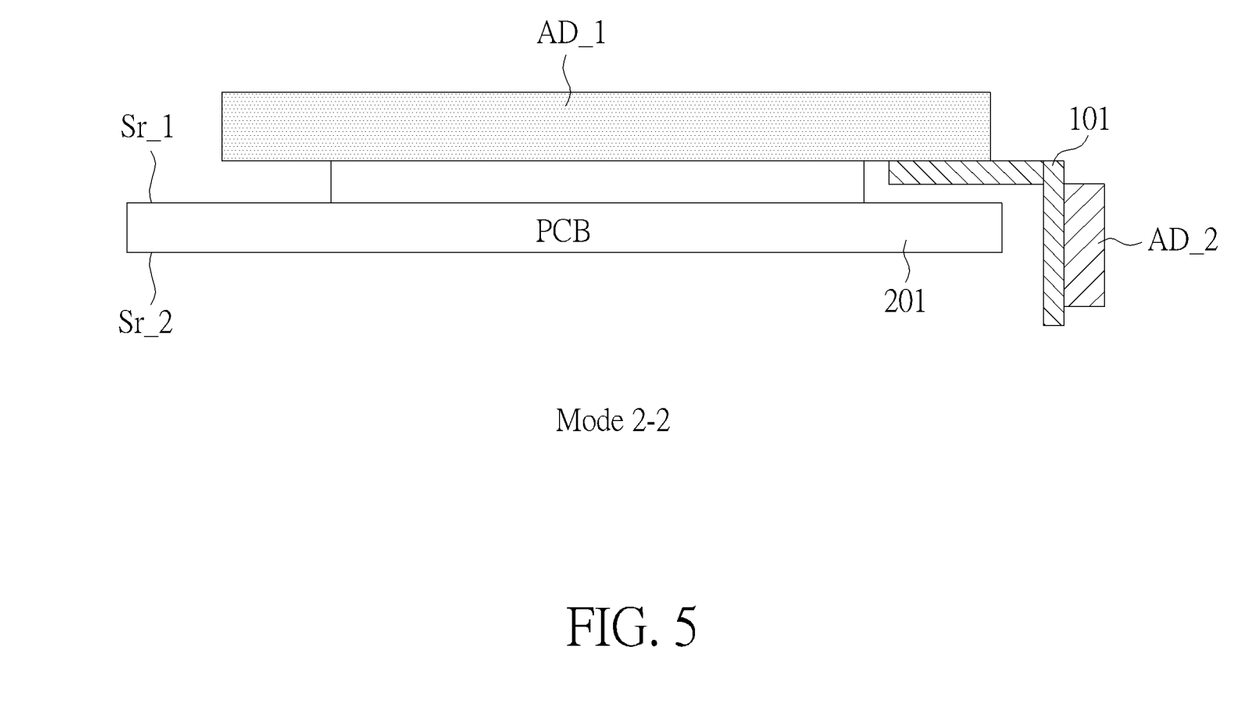

The Mode 2-2 in FIG. 5 and the mode 2-1 in FIG. 4 represent the same mode, and FIG. 5 is a diagram viewed from the Y direction of the diagram marked with Mode 2-2 in FIG. 4. In FIG. 5, a distance between a first surface Sr_1 of the first PCB 201 and the first antenna device AD_1 is smaller than a distance between a second surface Sr_2 of the first PCB 201 and the first antenna device AD_1. In one embodiment, the first surface Sr_1 and the second surface Sr_2 are opposite and parallel with each other. In such embodiment, the first FPC 101 is bended following a direction from the first surface Sr_1 to the second surface Sr_2 when the second antenna device AD_2 changes from the first location to the second location.

As illustrated above, the second antenna device AD_2 can be an antenna board which can be implemented by a PCB. However, the second antenna device AD_2 can be implemented by other components, for example, the second antenna device AD_2 can be implemented by a BT (Bismaleimide Triazine) substrate. Also, in the embodiment of FIG. 6, the second antenna device AD_2 is implemented by a second FPC. In one embodiment, the second FPC is thicker than the first FPC 101.

Figure 6:
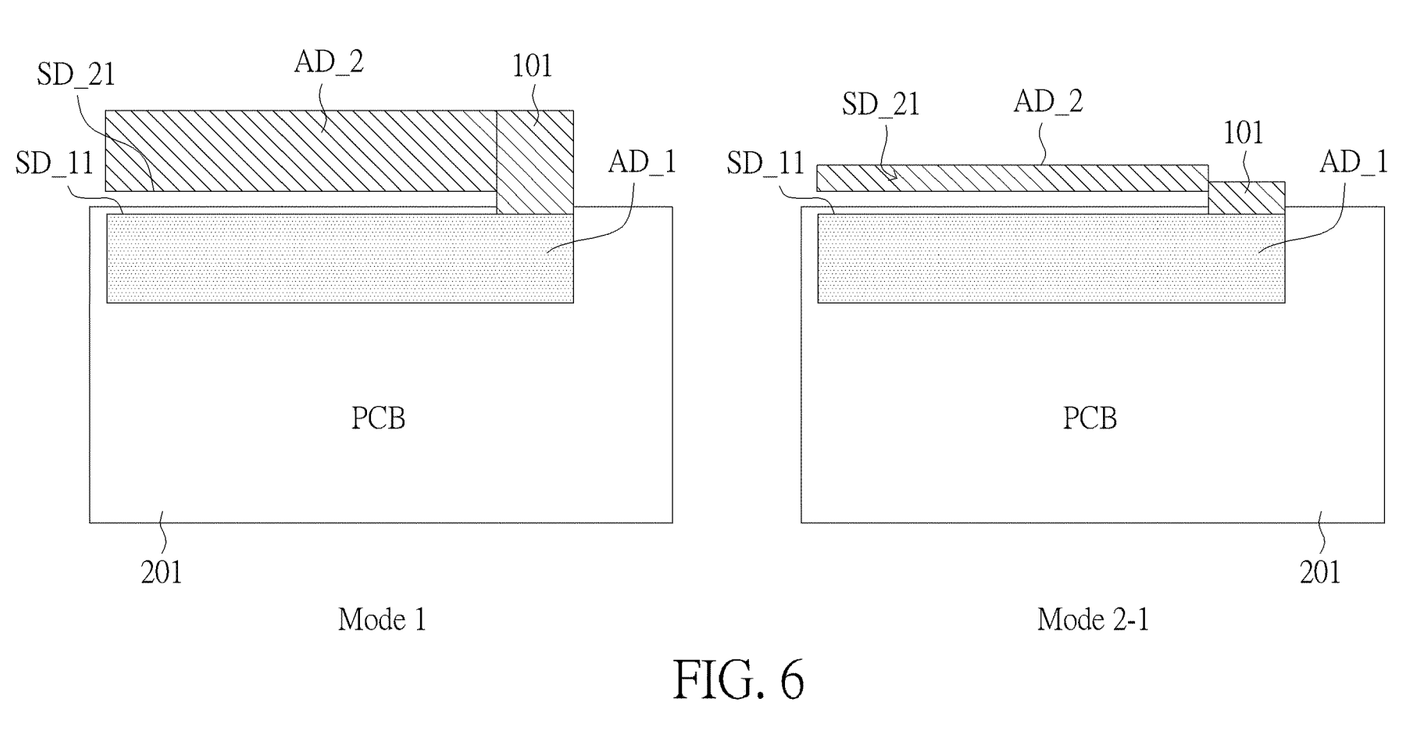

In the embodiment of FIG. 6, a first side SD_11 of the first antenna device AD_1 and a first side SD_21 of the second antenna device AD_2 are parallel with each other. For more detail, a first side SD_11 of the first antenna device AD_1 and a first side SD_21 of the second antenna device AD_2 are parallel with each other, regardless of whether the second antenna device AD_2 is located at the first location or the second location. Please note, the descriptions of "the first side SD_11 is parallel with the first side SD_21" can mean the "the first side SD_11 or an extension line of the first side SD_11 is parallel with the first side SD_21 or an extension line of the first side SD_21".

Figure 7:
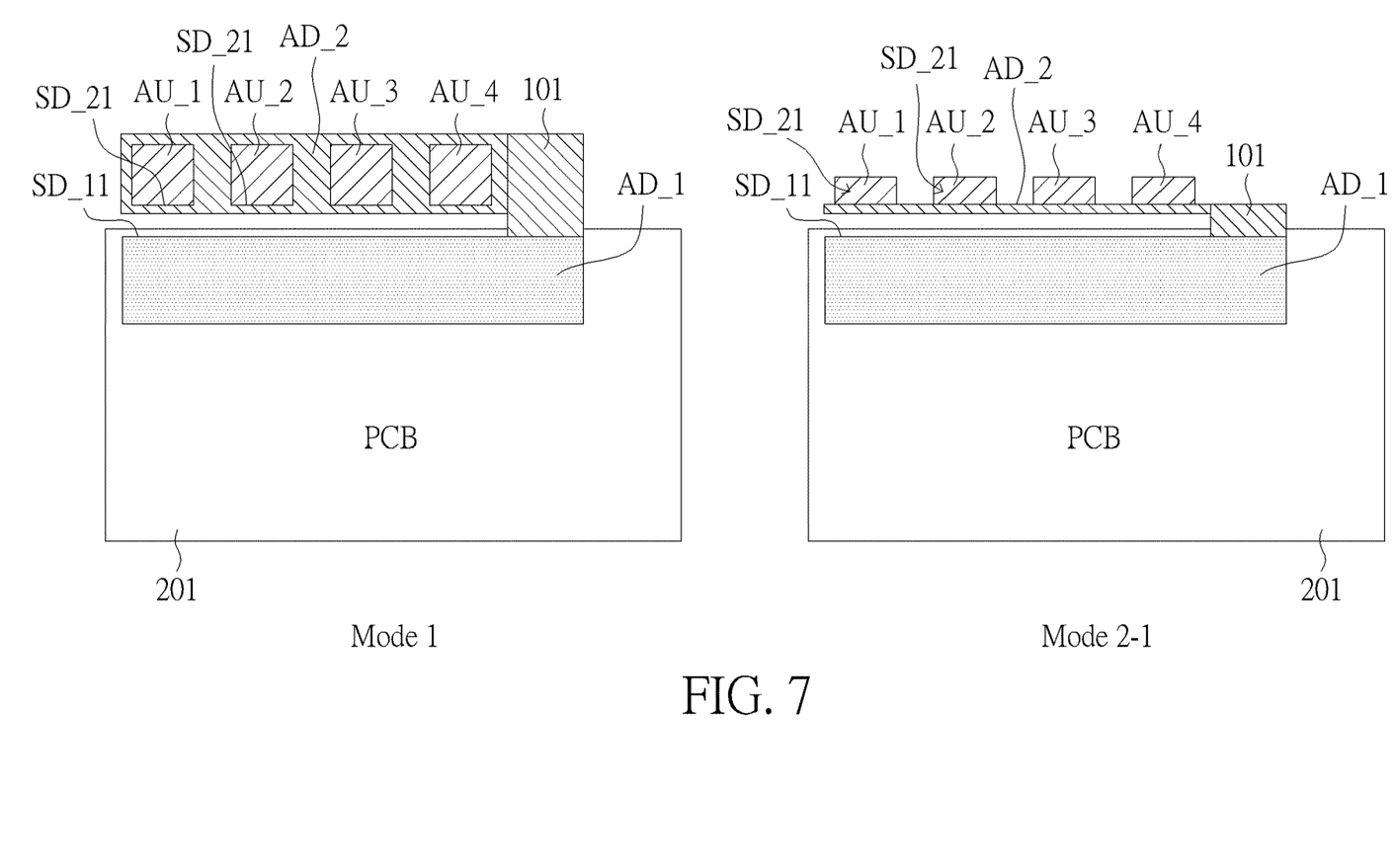

The second antenna device AD_2 is not limited to be implemented by above-mentioned antenna boards or FPC. In the embodiment of FIG. 7, the second antenna device AD_2 is implemented by a plurality of antenna units AU_1, AU_2, AU_3 and AU_4. The antenna units AU_1, AU_2, AU_3 and AU_4 can be implemented by a PCB, a second FPC or ceramic, or any material that be designed with antennas.

In the embodiment of FIG. 7, the second antenna device AD_2 is at a first location in the Mode 1 and is at a second location in the Mode 2-1. A first side SD_11 of the first antenna device AD_1 and a first side SD_21 of the second antenna device AD_2 are parallel with each other. For more detail, a first side SD_11 of the first antenna device AD_1 and a first side SD_21 of the second antenna device AD_2 are parallel with each other, regardless of whether the second antenna device AD_2 is located at the first location or the second location. Please note, the descriptions of "the first side SD_11 is parallel with the first side SD_21" can mean the "the first side SD_11 or an extension line of the first side SD_11 is parallel with the first side SD_21 or an extension line of the first side SD_21". Further, in the embodiment of FIG. 7, the first side SD_21 can mean a side of at least one of the antenna units AU_1, AU_2, AU_3 and AU_4. For example, the antenna units AU_1 and AU_2 can both have first sides SD_21 which are parallel with the first side SD_11.

Figure 8:
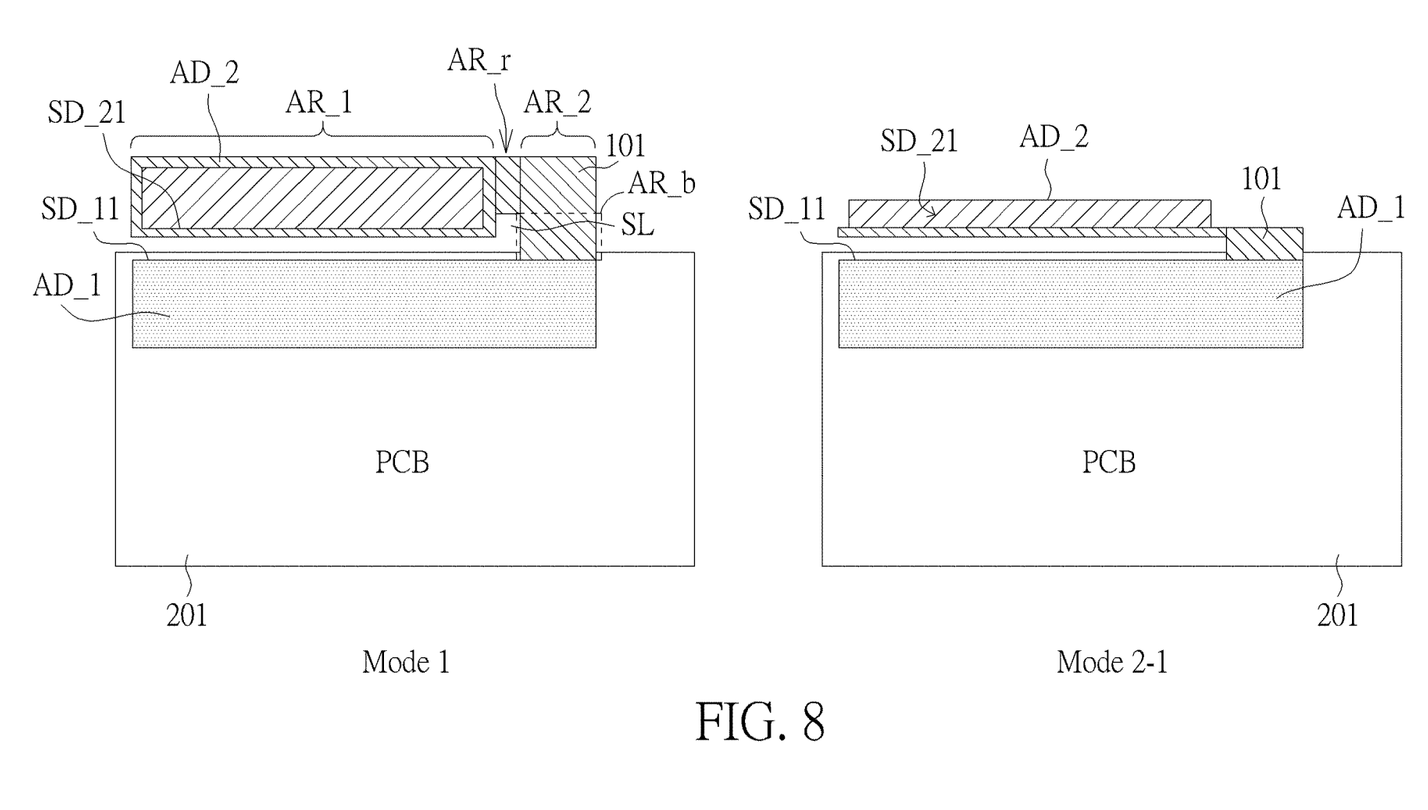

In the embodiment of FIG. 8, the first FPC 101 comprises a first area AR_1, a second area AR_2, and a bending area AR_b. Further, a reducing region AR_r is provided between the first area AR_1 and the second area AR_2. The second antenna device AD_2 is provided on the first area AR_1. A slot SL exists between the first area AR_1 and the second area AR_2 since the reducing region AR_r has a smaller area. For more detail, a longest length of the reducing region AR_r is smaller than shortest lengths of the first area AR_1 and the second area AR_2, thereby forms the slot SL. Due to the slot SL and the reducing region AR_r, the necessary material of the first FPC 101 can be reduced, and the dimension of the first FPC 101 can also be reduced.

The second antenna device AD_2 is at a first location in the Mode 1 and is at a second location in the Mode 2-1. In the embodiment of FIG. 8, a first side SD_11 of the first antenna device AD_1 and a first side SD_21 of the second antenna device AD_2 are parallel with each other. For more detail, a first side SD_11 of the first antenna device AD_1 and a first side SD_21 of the second antenna device AD_2 are parallel with each other, regardless of whether the second antenna device AD_2 is located at the first location or the second location. Please note, the descriptions of "the first side SD_11 is parallel with the first side SD_21" can mean the "the first side SD_11 or an extension line of the first side SD_11 is parallel with the first side SD_21 or an extension line of the first side SD_21".

Figure 9:
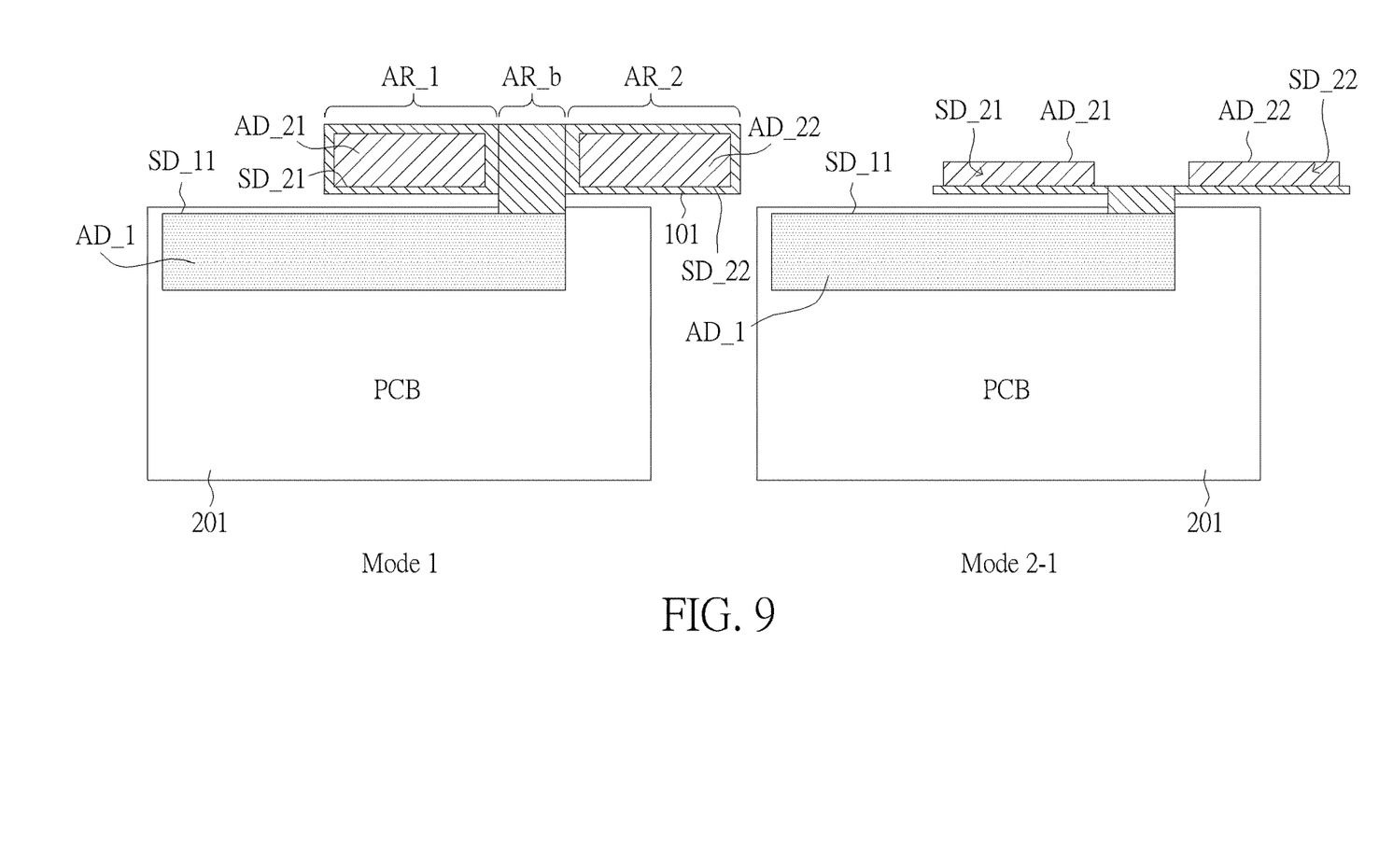

In the above-mentioned embodiment, only one second antenna device AD_2 is provided. However, the antenna module provided by the present invention can comprise more than one second antenna devices. Also, the first FPC 101 provided by the present invention can have another shape rather than limited to the shapes illustrated in above mentioned embodiments. In the embodiment of FIG. 9, the first FPC 101 is a T shape, and comprises a first area AR_1, a second area AR_2, and a bending area AR_b. The second antenna devices can be distributed on at least one of the first area AR_1 and the second area AR_2. For example, the second antenna devices AD_21, AD_22 are distributed on the first area AR_1 and the second area AR_2. That is, at least one of the second antenna devices is provided on the first area AR_1 and at least one of the second antenna devices is provided on the second area AR_2. However, the second antenna device can be provided on only one of the first area AR_1 and the second area AR_2.

In the embodiment of FIG. 9, the second antenna devices AD_21, AD_22 are at a first location in the Mode 1 and are at a second location in the Mode 2-1. A first side SD_11 of the first antenna device AD_1 and a first side SD_21 of the second antenna devices AD_21 are parallel with each other. For more detail, a first side SD_11 of the first antenna device AD_1 and a first side SD_21 of the second antenna devices AD_2 are parallel with each other, regardless of whether the second antenna devices AD_21 is located at the first location or the second location. Please note, the descriptions of "the first side SD_11 is parallel with the first side SD_21" can mean the "the first side SD_11 or an extension line of the first side SD_11 is parallel with the first sides SD_21 or an extension line of the first side SD_21". Please note, the second antenna devices AD_21 is applied for explaining in this example, but the second antenna devices AD_22 can follow the same rule. For example, the second antenna devices AD_22 has a first side SD_22 parallel with the first side SD_11. Besides, in one example of the embodiment of FIG. 9, the first side of the first antenna device is a longest side thereof and the first side of the second antenna device is a longest side thereof.

The mode 2-2 in FIG. 3 are not illustrated in the embodiments of FIG. 6, FIG. 7, FIG. 8 and FIG. 9. However, the structure and operation illustrated in FIG. 3 can also be applied in the embodiments of FIG. 6, FIG. 7, FIG. 8 and FIG. 9. Additionally, the embodiment of FIG. 2 is taken as an example for explaining the embodiments of FIG. 6, FIG. 7, FIG. 8 and FIG. 9. However, the concept disclosed in FIG. 6, FIG. 7, FIG. 8 and FIG. 9 can be applied to other embodiments. For example, FIG. 10 is an embodiment in which the concept disclosed in FIG. 9 is applied to the embodiment of FIG. 4.

Figure 10:
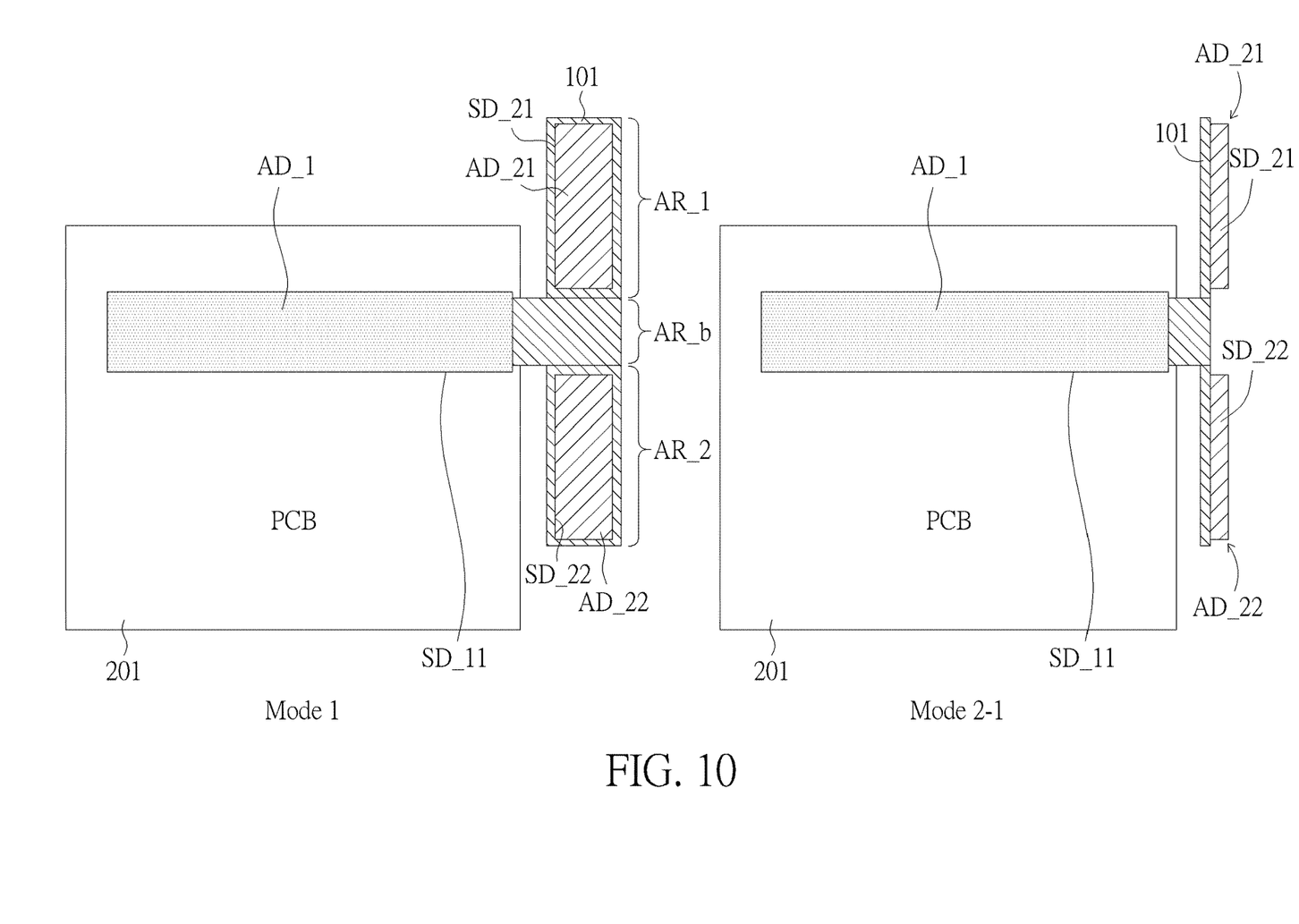

In the embodiment of FIG. 10, the first FPC 101 comprises a first area AR_1, a second area AR_2, and a bending area AR_b. The second antenna devices can be distributed on at least one of the first area AR_1 and the second area AR_2. For example, the second antenna devices AD_21, AD_22 are distributed on the first area AR_1 and the second area AR_2. That is, at least one of the second antenna devices is provided on the first area AR_1 and at least one of the second antenna devices is provided on the second area AR_2. However, the second antenna device can be provided on only one of the first area AR_1 and the second area AR_2.

The second antenna devices AD_21, AD_22 are at a first location in the Mode 1 and are at a second location in the Mode 2-1. In the embodiment of FIG. 10, a first side SD_11 of the first antenna device AD_1 and a first side SD_21 of the second antenna device AD_21 is perpendicular with each other. For more detail, a first side SD_11 of the first antenna device AD_1 and a first side SD_21 of the second antenna device AD_21 is perpendicular with each other, regardless of whether the second antenna device AD_21 is located at the first location or the second location. Please note, the descriptions of "the first side SD_11 is perpendicular with the first side SD_21" can mean the "the first side SD_11 or an extension line of the first side SD_11 is perpendicular with the first side SD_21 or an extension line of the first side SD_21". Please note, the second antenna devices AD_21 is applied for explaining in this example, but the second antenna devices AD_22 can follow the same rule. For example, the second antenna devices AD_22 can have a first side SD_22 parallel with the first side SD_11. Besides, in one example of the embodiment of FIG. 10, the first side of the first antenna device is a longest side thereof and the first side of the second antenna device is a longest side thereof.

Please note, the sizes, locations and shapes of all components in above-mentioned embodiments are not limited to the above-mentioned examples. Any variation based on the above-mentioned disclosure should fall in the scope of the present invention. Further, as above-mentioned, the first PCB 201 can be a PCB of a display. Therefore, a system comprising the antenna modules illustrated in above-mentioned embodiments and the display can be regarded as an antenna system. The antenna system can be, for example, a mobile phone, a tablet computer or a notebook.

In view of above-mentioned embodiments, an antenna module which can change directions of antennas via simplified structures is provided. Further, an antenna system applying the antenna module is also disclosed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An antenna module, comprising:
   a first antenna device, which is an AiM (Antenna in Module) and comprises at least one first antenna;
   a first FPC (flexible printed circuit), coupled to an outer surface of the first antenna device via a conductive structure, the first FPC comprising:
   a first area, a second area, and a reducing area; and
   at least one second antenna device, coupled to the first FPC, comprising at least one second antenna;
   wherein the second antenna device is provided on the first area, and a slot and the reducing area are provided between the first area and the second area.

2. The antenna module of claim 1, wherein the conductive structure comprises conductive balls or conductive bumps.

3. The antenna module of claim 1, wherein the second antenna device is formed by at least one antenna board.

4. The antenna module of claim 3, wherein the antenna board uses a BT (Bismaleimide Triazine) substrate, a PCB (printed circuit board) or a second FPC.

5. The antenna module of claim 1, wherein the second antenna device can be changed from a first location to a second location via the first FPC, wherein a first side of the first antenna device and a first side of the second antenna device are parallel with each other.

6. The antenna module of claim 1, wherein the second antenna device can be changed from a first location to a second location via the first FPC, wherein a first side of the first antenna device and a first side of the second antenna device are perpendicular with each other.

7. The antenna module of claim 1, wherein the second antenna devices comprises a plurality of antenna units, wherein the antenna units are provided in a PCB, a second FPC or made of ceramic.

8. The antenna module of claim 1, wherein the first FPC comprises a first area, a second area, and a bending area;
   wherein at least one of the second antenna device is provided on at least one of the first area and the second area;

wherein the first area, the second area and the bending area form a T shape.

9. An antenna system, comprising:
a first substrate;
a first antenna device, which is an AiM and provided on the first substrate, comprising at least one first antenna;
a first FPC (flexible printed circuit), coupled to an outer surface of the first antenna device via a conductive structure, the first FPC comprising:
   a first area, a second area, and a reducing area; and
at least one second antenna device, coupled to the FPC, comprising at least one second antenna;
wherein the second antenna device is provided on the first area, and a slot and the reducing area are provided between the first area and the second area.

10. The antenna system of claim 9, wherein the conductive structure comprises conductive balls or conductive bumps.

11. The antenna system of claim 9, wherein the second antenna device is formed by at least one antenna board.

12. The antenna system of claim 11, wherein the antenna board uses a BT substrate, a second PCB or a second FPC.

13. The antenna system of claim 9, wherein the second antenna device can be changed from a first location to a second location via the first FPC, wherein a first side of the first antenna device and a first side of the second antenna device are parallel with each other;
wherein a distance between a first surface of the first substrate and the first antenna device is smaller than a distance between a second surface of the first substrate and the first antenna device;
wherein the first FPC is bended following a direction from the first surface to the second surface when the second antenna device changes from the first location to the second location.

14. The antenna system of claim 9, wherein the second antenna device can be changed from a first location to a second location via the first FPC, wherein a first side of the first antenna device and a first side of the second antenna device are perpendicular with each other;
wherein a distance between a first surface of the first substrate and the first antenna device is smaller than a distance between a second surface of the first substrate and the first antenna device;
wherein the first FPC is bended following a direction from the first surface to the second surface when the second antenna device changes from the first location to the second location.

15. The antenna system of claim 9, wherein the second antenna devices comprises a plurality of antenna units, wherein the antenna units are provided in a PCB, a second FPC or made of ceramic.

16. The antenna system of claim 9, wherein the first FPC comprises
a first area, a second area, and a bending area;
wherein at least one of the second antenna device is provided on the first area and the second area;
wherein the first area, the second area and the bending area form a T shape.

17. The antenna system of claim 9, wherein the first substrate is a PCB of a display.

* * * * *